(12) United States Patent
Chung et al.

(10) Patent No.: US 9,584,003 B2
(45) Date of Patent: Feb. 28, 2017

(54) ENERGY-HARVESTING DEVICE

(71) Applicant: TAIWAN SEMICONDUCTOR MANUFACTURING COMPANY, LTD., Hsinchu (TW)

(72) Inventors: Tien-Kan Chung, Pingzhen (TW); Wen-Chuan Tai, Dayuan Township (TW); Yao-Te Huang, Hsinchu (TW); Hsin-Ting Huang, Bade (TW); Shang-Ying Tsai, Pingzhen (TW); Chang-Yi Yang, Hsinchu (TW); Chia-Ming Hung, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/993,142

(22) Filed: Jan. 12, 2016

(65) Prior Publication Data

US 2016/0126819 A1 May 5, 2016

Related U.S. Application Data

(60) Continuation of application No. 14/567,423, filed on Dec. 11, 2014, now Pat. No. 9,246,401, which is a
(Continued)

(51) Int. Cl.
*H02P 9/04* (2006.01)
*H02K 35/04* (2006.01)
(Continued)

(52) U.S. Cl.
CPC ............ *H02K 35/04* (2013.01); *B81B 7/02* (2013.01); *G01P 15/11* (2013.01); *H01F 5/003* (2013.01);
(Continued)

(58) Field of Classification Search
None
See application file for complete search history.

(56) References Cited

U.S. PATENT DOCUMENTS

| 4,907,065 A | 3/1990 | Sahakian |
| 6,215,318 B1 | 4/2001 | Schoefthaler et al. |

(Continued)

FOREIGN PATENT DOCUMENTS

CN 101615614 12/2009

OTHER PUBLICATIONS

Emmerich, Harald, et al., "Magnetic Field Measurements with a Novel Surface Micromachined Magnetic-Field Sensor", IEEE Transactions on Electron Devices, vol. 47, No. 5, May 2000, pp. 972-977.
(Continued)

*Primary Examiner* — Tho D Ta
(74) *Attorney, Agent, or Firm* — Hauptman Ham, LLP

(57) ABSTRACT

A semiconductor device includes a moveable element over a substrate, wherein the moveable element is moveable relative to the substrate. The semiconductor device further includes a first anchor portion connected to the substrate; and a second anchor portion connected to the substrate on an opposite side of the moveable element from the first anchor portion. The semiconductor device further includes a first connector configured to connect the moveable element to the first anchor portion. The semiconductor device further includes a second connector configured to connect the moveable element to the second anchor portion. The semiconductor device further includes a conductive wire loop on the moveable element; and a connection wire electrically connected to a first end of the conductive wire loop, wherein the connection wire extends across the first connector to the first anchor portion.

20 Claims, 25 Drawing Sheets

Related U.S. Application Data continuation of application No. 14/229,068, filed on Mar. 28, 2014, now Pat. No. 8,928,162, which is a division of application No. 13/047,502, filed on Mar. 14, 2011, now Pat. No. 8,723,343.

(51) Int. Cl.
  *G01P 15/11* (2006.01)
  *H02K 15/00* (2006.01)
  *H01F 5/00* (2006.01)
  *H02M 7/04* (2006.01)
  *B81B 7/02* (2006.01)
  *H02N 1/00* (2006.01)

(52) U.S. Cl.
  CPC .............. *H02K 15/00* (2013.01); *H02M 7/04* (2013.01); *H02N 1/006* (2013.01); *Y10T 29/49009* (2015.01)

(56) References Cited

U.S. PATENT DOCUMENTS

| | | | |
|---|---|---|---|
| 6,275,034 B1 | 8/2001 | Tran et al. | |
| 7,498,681 B1 | 3/2009 | Kellogg et al. | |
| 7,525,205 B2 | 4/2009 | Mabuchi et al. | |
| 7,535,148 B2* | 5/2009 | Harris | H02K 35/04 310/15 |
| 7,579,757 B2 | 8/2009 | Kulah et al. | |
| 8,324,998 B2* | 12/2012 | Takahashi | H02K 35/02 310/15 |
| 8,432,049 B2* | 4/2013 | Jung | F03B 13/262 290/1 R |
| 8,665,042 B2* | 3/2014 | Takahashi | H02K 35/02 335/207 |
| 8,928,162 B2 | 1/2015 | Chung et al. | |
| 9,048,717 B2* | 6/2015 | Takahashi | H02K 35/02 |
| 2008/0048521 A1 | 2/2008 | Mabuchi et al. | |
| 2010/0187835 A1 | 7/2010 | Hohlfeld et al. | |
| 2011/0049652 A1 | 3/2011 | Wu et al. | |
| 2012/0104874 A1* | 5/2012 | Hwang | H02K 35/04 310/25 |

OTHER PUBLICATIONS

Shearwood, C., et al., "Development of an Electromagnetic Micro-Generator", Electronics Letters, Oct. 23, 1997, vol. 33, No. 22, pp. 1883-1884.

Kulah, Haluk, et al., "Energy Scavenging From Low-Frequency Vibrations by Using Frequency Up-Conversion for Wireless Sensor Applications", IEEE Sensors Journal, vol. 8, No. 3, Mar. 2008, pp. 261-268.

Office Action dated May 26, 2014 from corresponding No. TW 100137642.

* cited by examiner

ENERGY-HARVESTING DEVICE

PRIORITY CLAIM

The present application is a continuation of U.S. application Ser. No. 14/567,423, filed Dec. 11, 2014, which is a continuation of U.S. application Ser. No. 14/229,068, filed Mar. 28, 2014, now U.S. Pat. No. 8,928,162, issued Jan. 6, 2015, which is a divisional of U.S. application Ser. No. 13/047,502, filed Mar. 14, 2011, now U.S. Pat. No. 8,723,343, issued May 13, 2014, all of which are incorporated by reference herein in their entireties.

BACKGROUND

Sensors are sometimes placed in locations where there is no power supply or the power supply is limited by, for example, the battery life or size. Some Micro-electromechanical systems (MEMS) sensors have a power consumption great enough to impact battery life in many applications in which the MEMS sensors would be useful. Such MEMS sensors include sensors for detecting position, velocity, acceleration or magnetic fields. Applications for such MEMS sensors include, for example, navigation for smart phones.

Kinetic electromagnetic-induction MEMS energy-harvesters convert mechanical energy into electrical energy by converting mechanical motion, such as deformation, displacement, velocity, and/or acceleration, of a portion or all of an energy-harvester into electrical current and voltage. The electrical energy is used to power an attached device.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
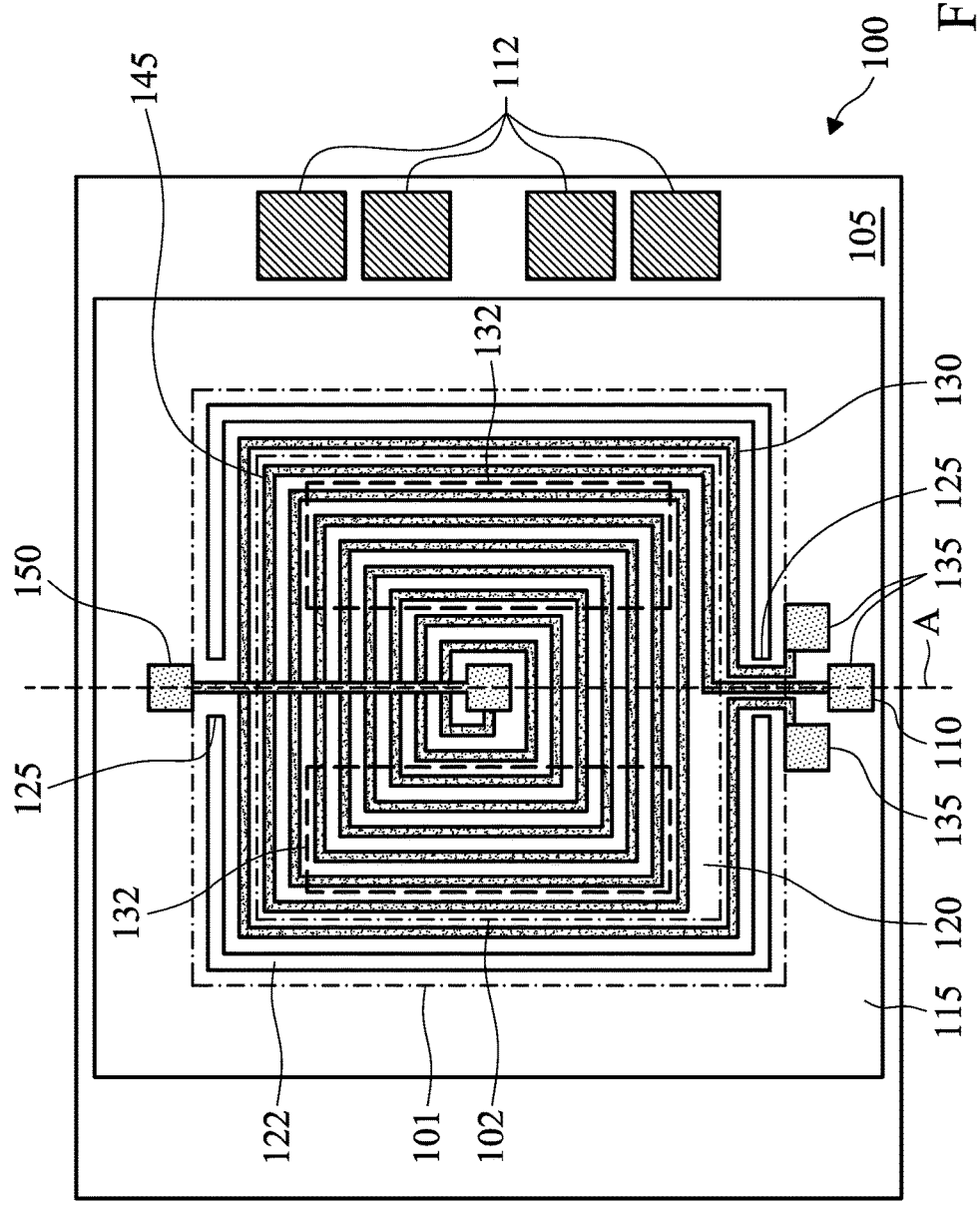
FIG. 1 is a device comprising a Lorentz force magnetic sensor and integrated energy-harvesting functionality according to an embodiment.

FIG. 1 is a device 100 comprising a Lorentz force magnetic sensor 101 and an integrated energy-harvester 102 formed within an area of the Lorentz force magnetic sensor according to an embodiment. The device 100 comprises a substrate 105 with a raised structure 110 and bond pads 112 formed on a surface of the substrate. The raised structure 110 comprises a rectangular-shaped outer portion 115 affixed to the substrate 105 and a rectangular-shaped inner portion 120 free from the substrate but connected to and formed within the outer portion 115. The inner portion 120 is separated from the outer portion 115 by a pair of slots 122 formed in the raised structure 110 and around a periphery of the inner portion. The Lorentz force magnetic sensor 101 comprises the inner portion 120, two elastic connections 125, a first wire loop 130 and electrodes 132. The two elastic connections 125 attach the outer portion 115 to the inner portion 120. The elastic connections 125 are formed in the middle of opposite sides of the inner portion 120, allowing the inner portion to rotate about an axis A defined by the elastic connections 125.

In at least some embodiments, there are greater or fewer numbers of elastic connections connecting the inner and outer portions. In at least some embodiments, the raised structure 110 and the inner and outer portions 120, 115 comprise different shapes, e.g., square, polygonal, ellipsoid, circular, etc. In at least some embodiments, the inner portion 120 is different shaped from the outer portion 115.

The first wire loop 130 is formed along an outer edge of the inner portion 120. Portions near the two ends of the wire loop 130 are formed on one of the elastic connections 125 so that the wire loop ends are formed on the outer portion 115. On the outer portion 115, the two ends of the first wire loop 130 are connected to pads 135. The pads 135 are connected (not shown for clarity) by vias formed through the raised structure 110 and wiring formed under the raised structure to bond pads 112 formed on the substrate 105. The electrodes 132 (positioning indicated by dashed lines) are formed on the substrate 105 underneath the inner portion 120. The raised structure 110 also comprises the integrated energy-harvester 102. The integrated energy-harvester 102 comprises a second wire loop 145 formed in a spiral loop arrangement inside the first wire loop 130 and a connection wire 150. In at least some embodiments, second wire loop 145 comprises a spiral loop having a circular, rectangular, or other shape. A portion of the second wire loop 145 near to a first end of the second wire loop is formed on one of the elastic connections 125 so that the first end of the second wire loop is formed on the outer portion 115. A second end of the second wire loop 145 is at the center of the inner portion 120 and connected to a first end of the connection wire 150. The connection wire 150 is formed to cross over the over spiral loops of the second wire loop 145 but does not electrically connect to the spiral loops at the crossing points. A portion of the connection wire 150 near to the second end of the connection wire is formed on the other of the elastic connections 125 so that the second end of the connection wire is formed on the outer portion 115. The second end of the connection wire 150 is connected by a via formed through the raised structure 110 and wiring formed the under the raised structure to bond pads 112. In some embodiments, one elastic connection 125 is used to connect the inner portion 120 with the outer portion 115. In other embodiments, more than two elastic connections 125 are used to connect the inner portion 120 with the outer portion 150. In some embodiments, the vias formed in the raised structure 110 and the wiring formed under the raised structure connect (not shown for clarity) the Lorentz force magnetic sensor 101 and the integrated energy-harvester 102 to a circuit formed on the substrate 105.

In operation, an alternating current supplied by a control circuit and passed around the first wire loop 130 causes a force on the wire proportional to a magnetic field in the vicinity of the first wire loop. In at least some embodiments, the control circuit is formed on the substrate 105. A component of the magnetic field in a direction in the plane of the inner portion 120 and perpendicular to the axis A causes a net force on the first wire loop 130 that causes the inner portion 120 to rotate about the axis A. Because the current passed around the first wire loop 130 alternates, the inner portion 120 oscillates back and forth around the axis A. Components of the magnetic field in other directions do not cause movement of the inner portion 120. The motion of the inner portion is detected capacitively as the inner portion moves by the electrodes 132. Thus, the Lorentz force magnetic sensor 101 measures one component of the magnetic field. Additional similar sensors positioned at different angles enable other components of the magnetic field to be sensed. The Lorentz force magnetic sensor 101 detects, for example, the magnetic field of the Earth.

The elastic connections 125 also act as return springs causing the position of the inner portion 120 to return to the plane of the outer portion 115 if no force is applied to the inner portion e.g., via first wire loop 130. The elasticity of the elastic connections 125 and the mass of the inner portion 120 cause the rotation mode of the inner portion to have a resonant frequency corresponding to the elasticity of the elastic connections 125 and a mass of the inner portion. If the alternating current frequency is selected to match the resonant frequency of the inner portion 120, the displacement of the inner portion due to the magnetic field is increased by a quality factor Q of the mechanical system formed by the mass of the inner portion 120 and elastic connections 125. Further, the response time to a change in the magnetic field increases by the quality factor Q.

The magnetic field impinging on the first wire loop 130 also passes through the spiral of the second wire loop 145 of the integrated energy-harvester 102. Changes in the magnetic flux enclosed by the area formed by the second loop 145 induce a voltage across the ends of the second loop. The voltage induced is proportional to the rate of change of the magnetic field coupled to the second loop 145. Thus, movement of device 100 into or out of a magnetic field, rotation of device 100 in a magnetic field or an alternating magnetic field passing through the sensor generated by, for example, power lines carrying alternating current causes voltage generation across the ends of the second loop 145.

Further, if the inner portion 120 moves due to the alternating current in the first wire loop 130 and an external magnetic field, a voltage will be induced across the second wire loop 145 by the rotation of the inner portion about the magnetic field.

Independent of how the voltage across the second wire loop 145 is generated, the voltage generates a current in the second wire loop. A power proportional to the product of the voltage across the second wire loop 145 and the current through the second wire loop is extracted from the second wire loop and the power provided by the integrated energy-harvester 102 used to supplement the power for driving the Lorentz force magnetic sensor 101. In some embodiments, the power extracted is sufficient to drive the device 100.

In some embodiments, the power is extracted from the second wire loop 145 of the integrated energy-harvester 102 at the same time as a measurement of the magnetic field passing through the Lorentz force magnetic sensor 101. In other embodiments, the power is extracted from the second wire loop 145 of the integrated energy-harvester 102 between measurements of the magnetic field passing through the Lorentz force magnetic sensor 101.

Figure 2:
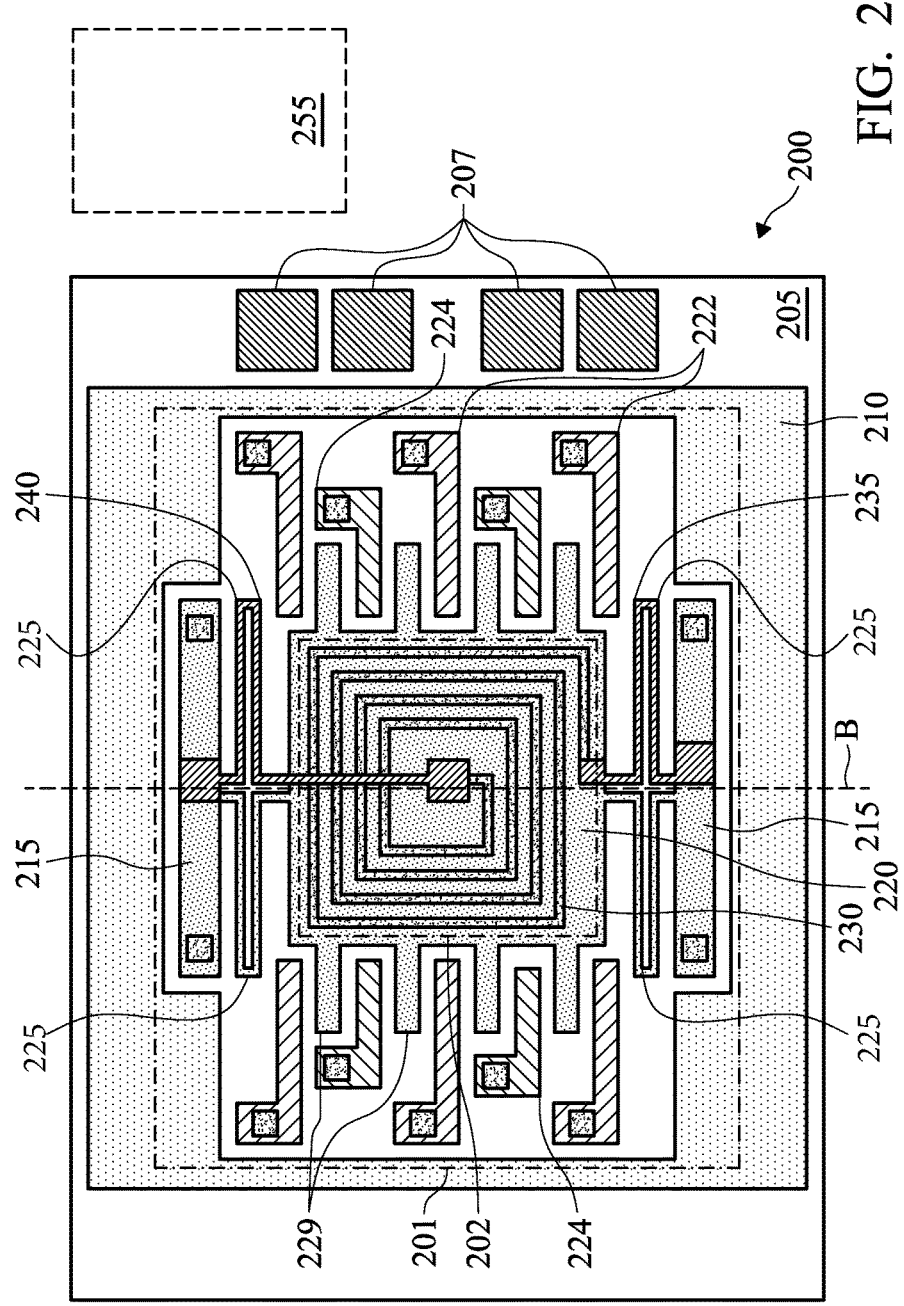
FIG. 2 is a device comprising a motion sensor and integrated energy-harvester according to an embodiment.

FIG. 2 is a device 200 comprising a motion sensor 201 and an integrated energy-harvester 202 formed within an area of the motion sensor according to an embodiment. The device 200 comprises a substrate 205 with raised structures and with bond pads 207 formed on a surface of the substrate 205. The raised structures comprise an outer portion 210, anchor portions 215 fixed to the substrate 205, a free portion 220 free from the substrate and two sets of sense electrodes 222, 224.

The motion sensor 201 comprises the anchor portions 215 the free portion 220, the sense electrodes 222, 224, and hairpin springs 225. The free portion 220 is attached to the anchor portions 215 by the hairpin springs 225 at corresponding top and bottom edges of the free portion with respect to the page. The hairpin springs 225 allow the free portion to move relative to the outer portion 210 in a direction along an axis B defined by the middle of the two sides of the free portion 220 attached to the hairpin springs 225. The free portion 220 is also free to move toward or away from the substrate 205, i.e., into or out of the page.

The free portion 220 comprises fingers 229 that extend away from the sides of the free portion not attached to the hairpin springs 225. The sense electrodes 222, 224 are formed on either side of the fingers 229, and are attached (not shown for clarity) to the bond pads 207 by vias formed through the raised structures 210, 215, 220, 222, 224 and wiring formed under the raised structures.

In some embodiments, the hairpin springs 225 are replaced by other elastic structures compatible with embodiments of the disclosure that allow the free portion 220 to move relative to the outer portion 210 in a direction along an axis B.

The device 200 further comprises the integrated energy-harvester 202 formed by a wire loop 230, a portion of a first connection wire 235 and a portion of a second connection wire 240 formed on the free portion 220. The wire loop 230 is formed in a spiral arrangement. A first end of the wire loop 230 is connected to the first connection wire 235 formed on one of the hairpin springs 225 and connecting across from the free portion 220 to one of the adjacent anchor portions 215. A second end of the wire loop 230 is at the center of the free portion 220 and connected to a first end of the second connection wire 240. The second connection wire 240 crosses over the spirals of the wire loop 230 but is not electrically connected thereto. The second connection wire 240 is formed on the other of the hairpin springs 225 and connects across from the free portion 220 to the other anchor portion 225. The second end of the first and second connection wires 235, 240 are connected (not shown for clarity) via vias formed through the anchor points 225 and wiring formed under raised structures 210, 215, 220, 222, 224 to the bond pads 207.

In operation, the free portion 220 is displaced relative to the substrate 205 when the substrate is accelerated. The mass of the free portion 220 acts as a proof mass. The proof mass is the mass which is accelerated by the deformation of the hairpin springs 225 if the substrate 205 is accelerated. The displacement relative to the substrate of the proof mass is determined by the acceleration, the elasticity of the hairpin springs 225, and the proof mass of the free portion 220. The displacement of the free portion 220 relative to the substrate is detected by the electrodes 222, 224 by electrostatic sensing. Thus, the acceleration of the motion sensor 201 is measured. In some embodiments, motion of the free portion 220 toward or away from the substrate is detected by optional electrodes formed on the substrate 205 underneath the free portion. Additional similar sensors positioned at different angles, enable other components of the acceleration to be measured.

A magnetic field impinging on the device 200 passes through the spiral of the wire loop 230. The magnetic field can be produced by an optional permanent magnet 255. Changes in the total magnetic field passing through the area formed by the wire loop 230 cause a voltage to be induced across the ends of the loop. The voltage induced is proportional to the rate of change of the magnetic field. Thus, movement into or out of a magnetic field, rotation in a magnetic field or an alternating magnetic field generated by, for example, power lines carrying alternating current cause a voltage to be generated across the wire loop 230.

Further, motion of the free portion 220 relative to the substrate 205 due to acceleration of the device 200 induces a voltage across the wire loop 230 if the motion of the wire loop causes a change in the magnetic flux enclosed by the wire loop. In some embodiments, the permanent magnet 255 is integrated into the device 200 or placed next to the device 200 to produce a suitable magnetic field which the wire loop 230 moves through when accelerated.

Independent of how the voltage across the wire loop 230 of the integrated energy-harvester 202 is generated the voltage is used to generate a current in the second wire loop. A power proportional to the product of the voltage across the second wire loop 230 and the current through the second wire loop is extracted from the second wire loop of the integrated energy-harvester 202 and used to supplement the power for driving the device 200. In some embodiments, the power extracted is sufficient to drive the device 200.

In some embodiments, the power is extracted from the second wire loop 230 at the same time as a measurement of the acceleration of the motion sensor 201. In other embodiments, the power is extracted from the second wire loop 230 between measurements of the acceleration of the motion sensor 201.

In at least one embodiment, both of the devices 100, 200 described above are fabricated using a MEMS process.

FIGS. 3A-3K are cross-sectional views of the device 100 or the device 200 during various stage of manufacturing according to an embodiment.

Figure 3A:
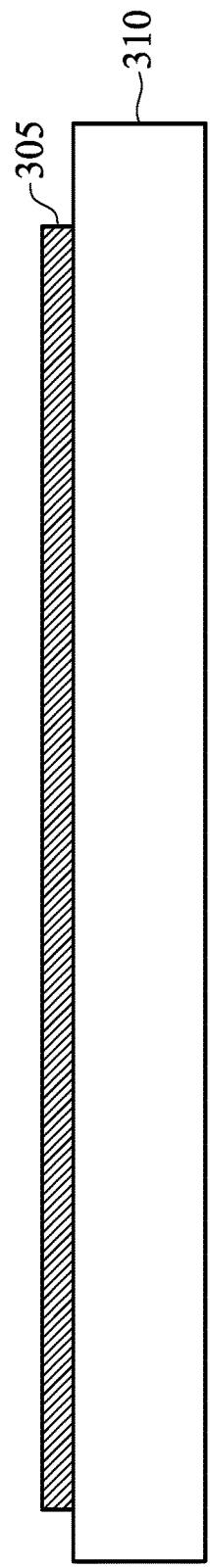
FIGS. 3A-3K are cross-sectional views of the device of FIG. 1 or the device of FIG. 2 during various stages of manufacturing according to an embodiment.

In FIG. 3A, a metal layer 305 is deposited on a substrate 310. The metal layer is fabricated using any process compatible with embodiments of the disclosure, for example, evaporation, sputtering, chemical vapor deposition or plating. The metal layer 305 comprises, for example, one or more of copper, gold, silver, nickel, titanium, tantalum, chromium, titanium nitrate, aluminum or alloys thereof.

Figure 3B:
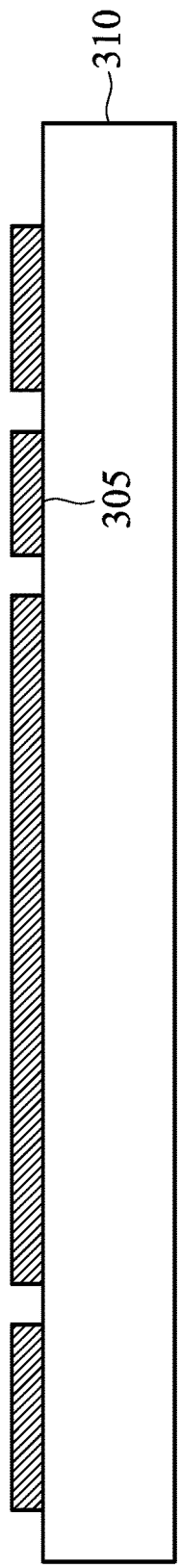

In FIG. 3B, the metal layer 305 is patterned using any process compatible with embodiments of the disclosure. The patterning process includes, for example, coating with photoresist, exposure of the photoresist through a mask and developing the photoresist. Subsequently, metal exposed through the photoresist is etched using, for example, a wet etching process, ion milling, reactive ion milling or plasma etching. In other embodiments, the metal layer 305 is formed and patterned by a lift-off process.

The patterned metal layer 305 forms the electrodes 132 and wiring from the vias to the bond pads 112 of the device 100 or the wiring, optional electrodes on the substrate and bond pads 207 of the device 200.

Figure 3C:
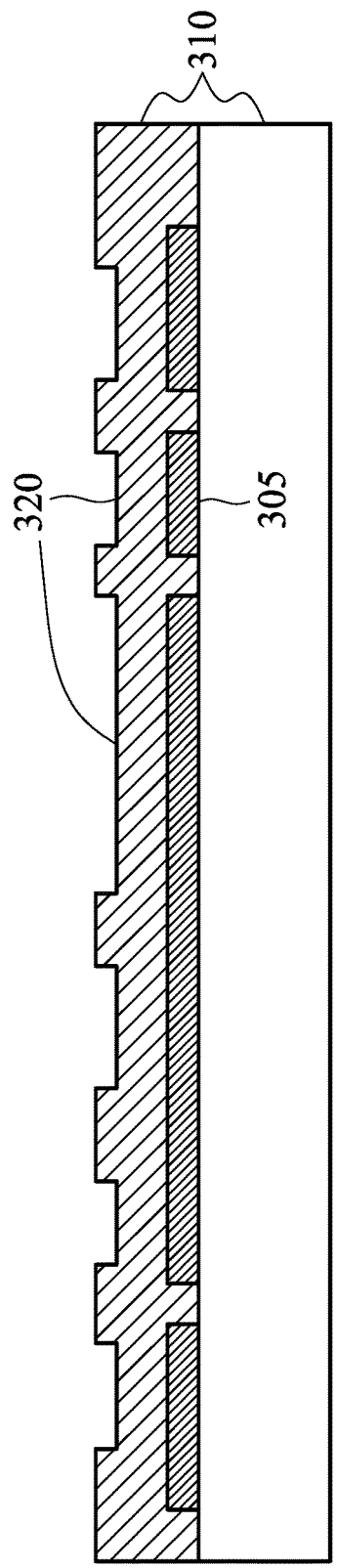

In FIG. 3C, an oxide layer 315 is formed over the metal layer 310. The oxide layer 315 is formed by, for example, chemical vapor deposition, sputtering or plasma enhanced chemical vapor deposition. The oxide layer 315 is patterned to form depressions 320 using processes similar to one or more of the photoresist process and etching process used to pattern layer 305.

Figure 3D:
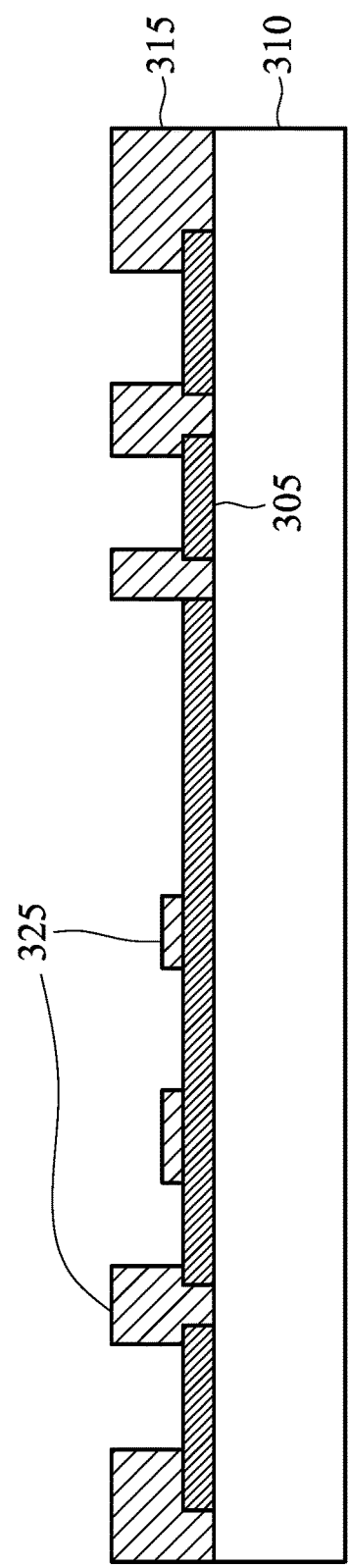

In FIG. 3D, the oxide layer 315 is further patterned to form pillars 325 of differing heights using processes similar to one or more of the photoresist process and etching process used to pattern layer 305.

Figure 3E:
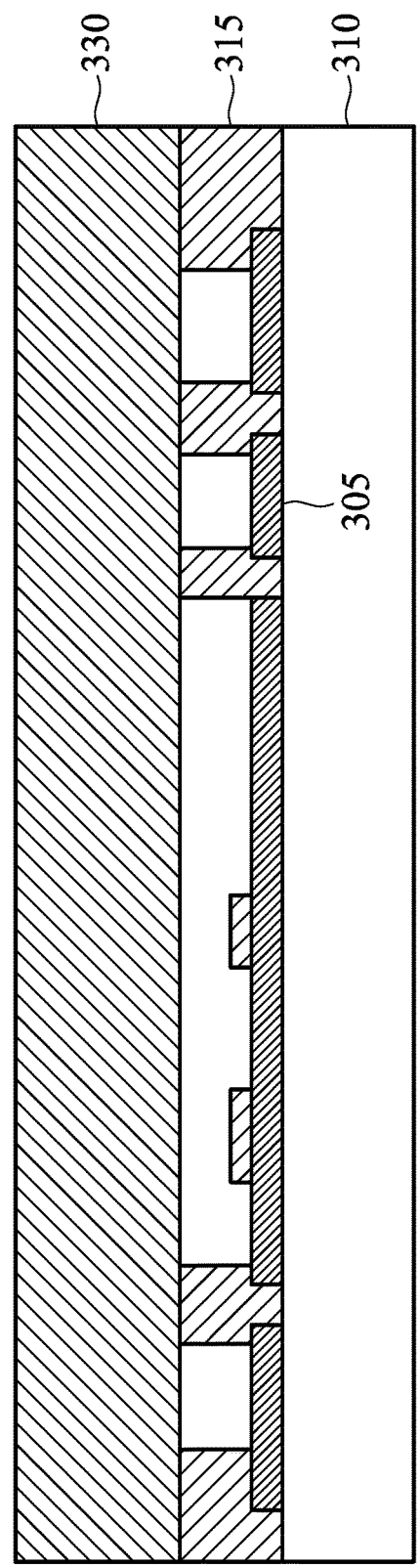

In FIG. 3E, a highly doped silicon wafer 330 is fusion bonded to the oxide layer 315. The highly doped silicon wafer 330 is ground down to a suitable thickness, for example, 30 μm. The free portion 220 of device 200 and the inner portion 120 of device 100 are ultimately formed from the ground highly doped silicon wafer 330. Because the highly doped silicon wafer 330 is quite thick compared with the thickness of a layer of polysilicon that it is reasonable to deposit, the free portion 220 of motion sensor 201 has a large mass compared with a layer of deposited polysilicon. Thus, the proof mass formed by the free portion 220 is more massive and the motion sensor more sensitive than a sensor formed by a layer of deposited polysilicon.

Figure 3F:
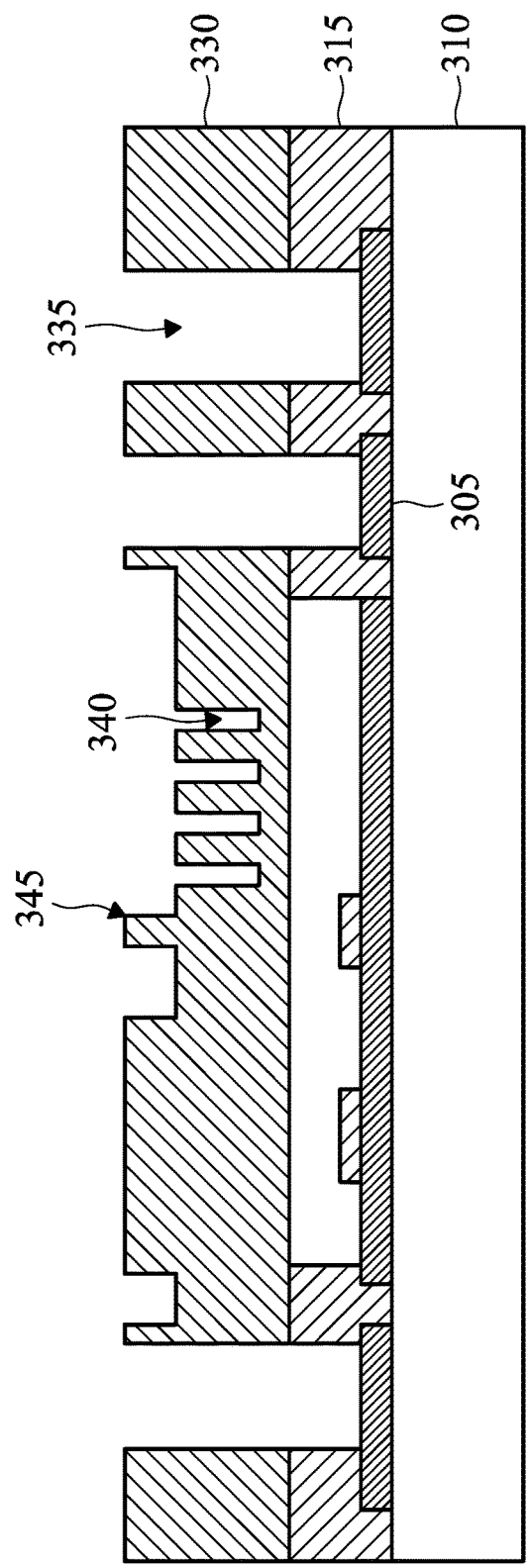

In FIG. 3F, the ground silicon wafer 330 is patterned and etched in one or more etch processes to form through-holes 335, trenches 340 and pillars 345. The patterning and etching processes similar to one or more of the photoresist process and etching process used to pattern layer 305.

Figure 3G:
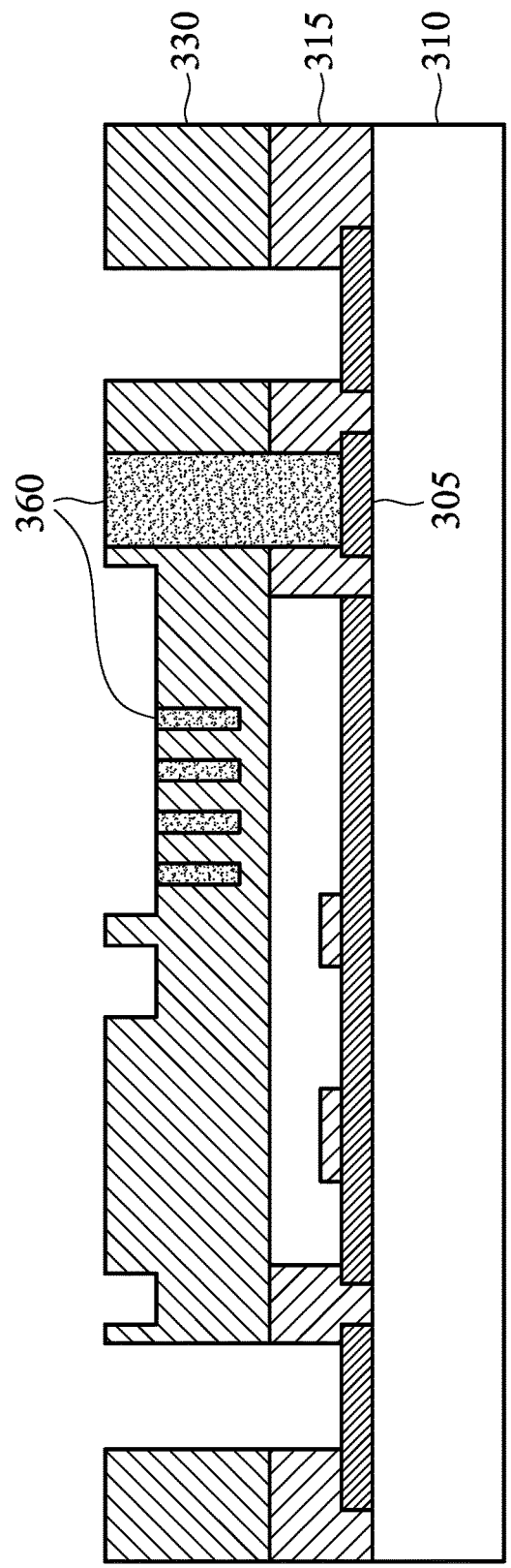

In FIG. 3G, the through-holes 335 and trenches 340 are filled with an electrical insulating material, for example silicon dioxide, and conducting material 360, for example, titanium nitrate and tungsten using, for example, a chemical vapor deposition and polishing process. The material in the trenches forms the first and second wire loops 130, 145 of the device 100 and the wire loop 230 of the device 200 and the vias connecting the first and second wire loops 130, 145 and the wire loop 230 to the bond pads 112, 207.

Figure 3H:
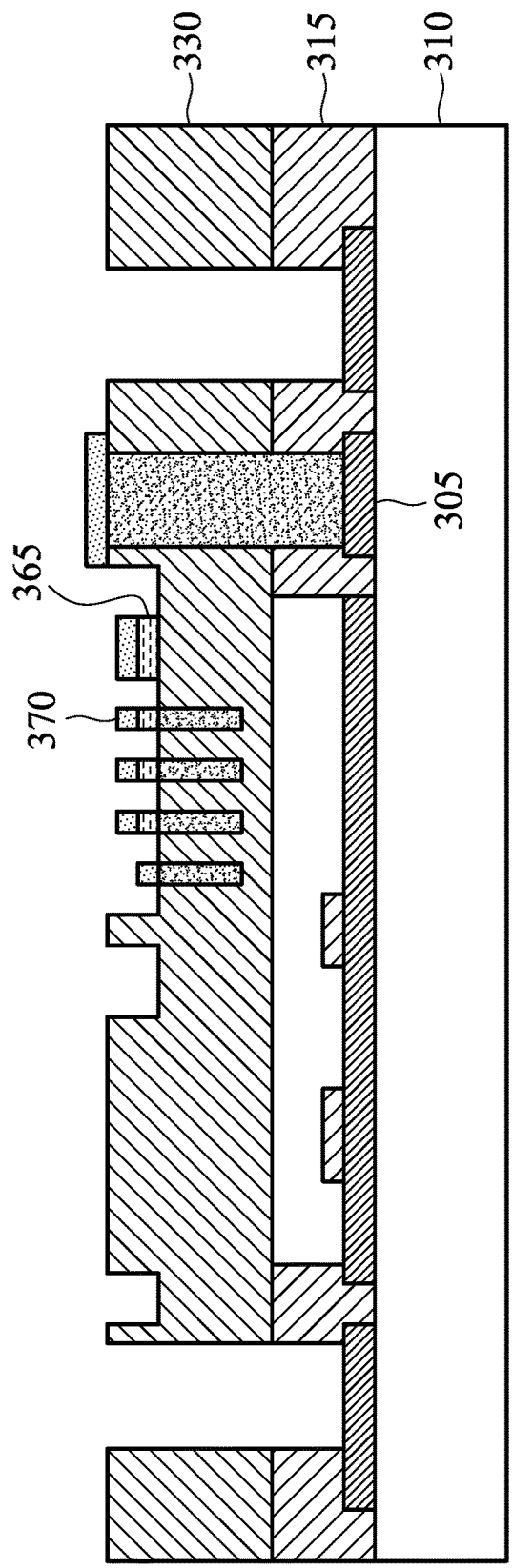

In FIG. 3H, insulation material 365, for example, silicon dioxide or silicon nitride is formed over the ground silicon wafer and the conducting material 360. Over the patterned insulation material 365, wiring 370 is formed. The wiring 370 corresponds to connection wire 150 of the device 100 and the first and second connection wires 235, 240 of the device 200.

Figure 3I:
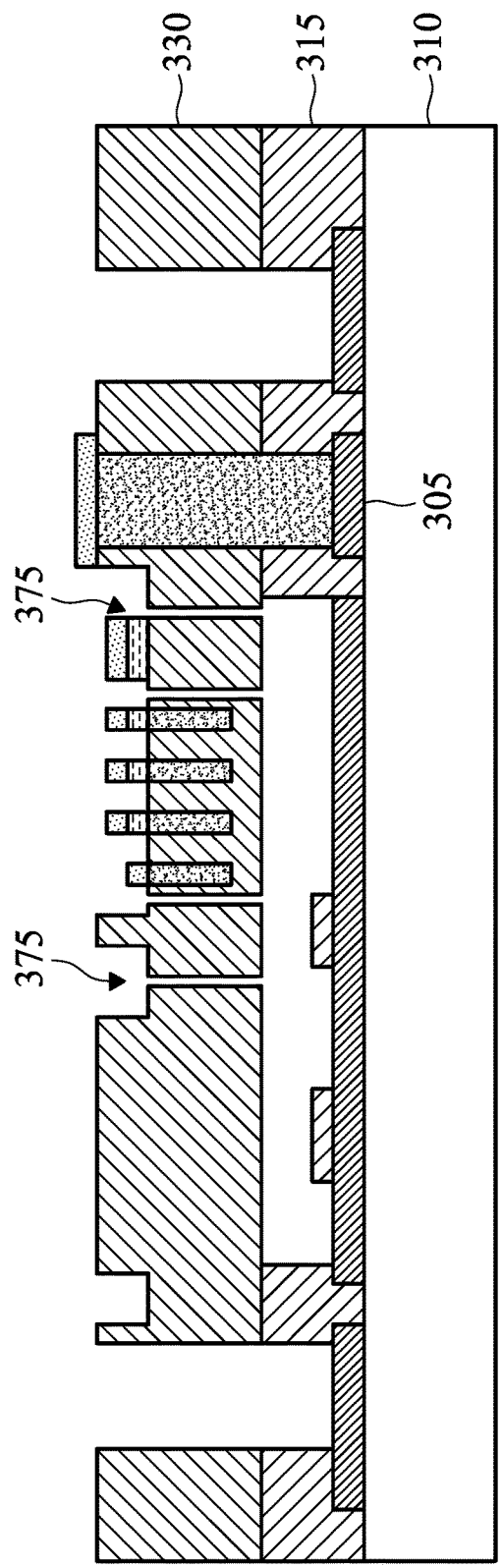

In FIG. 3I, slots 375 are etched through the ground silicon wafer 330. The slots 375 delineate the inner portion 120 and the elastic connections 125 of the device 100 and the hairpin springs 225, anchor portions 215, free portion 220 and electrodes 222, 224 of the device 200.

Figure 3J:
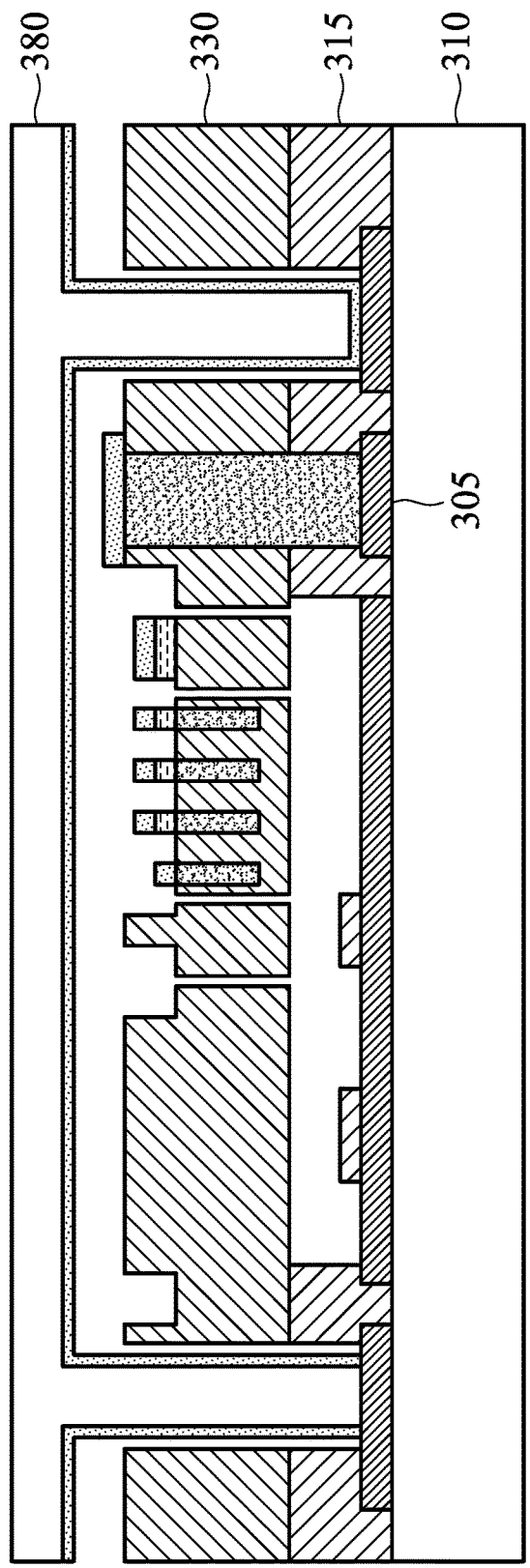

In FIG. 3J, a capping wafer 380 is bonded to portions of the metal 305 that form a bonding ring around the device 100 and the device 200.

Figure 3K:
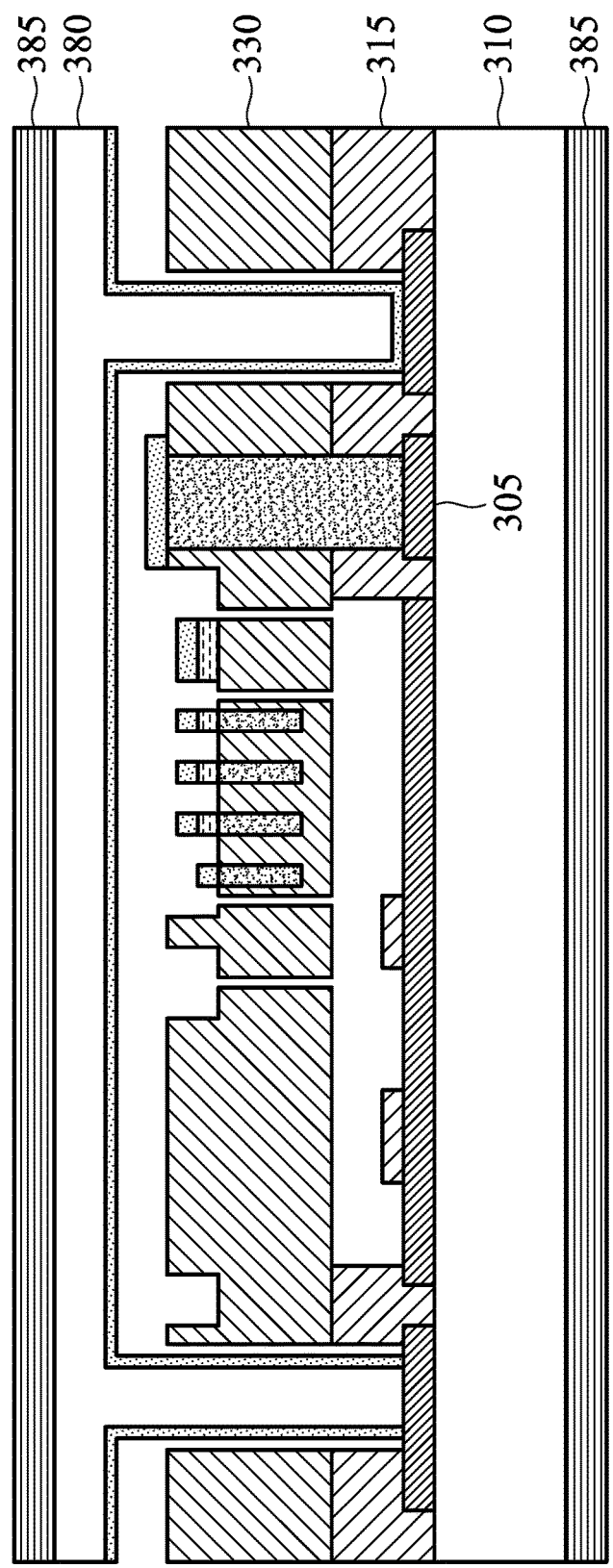

In FIG. 3K, an optional hard magnetic layer 385 is coated on the backside of the substrate 310 and a top surface of the capping wafer 380. The optional hard magnetic layer 385 is magnetized so that the field generated by the permanent magnet formed by the magnetized magnetic layer 385 causes current generation in the second wire loop 145 or the wire loop 230 if the second wire loop 145 or the wire loop 230 moves relative to the magnetic field.

FIGS. 4A-4L are cross-sectional views of the device 100 or the device 200 at various stages of manufacturing according to another embodiment.

Figure 4A:
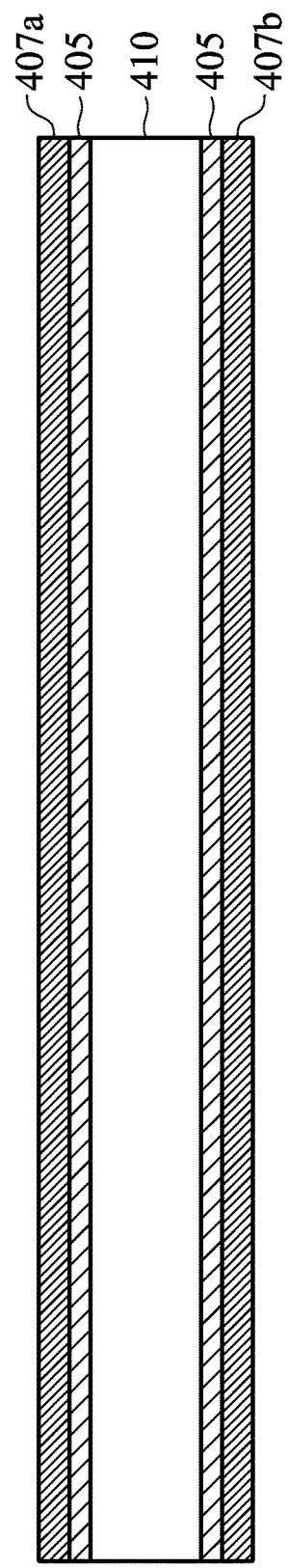
FIGS. 4A-4K are cross-sectional views of the device of FIG. 1 or the device of FIG. 2 during various stages of manufacturing according to another embodiment.

In FIG. 4A, insulating layers 405 are deposited on a top surface and a bottom surface of a substrate 410. Insulating layers 405 are formed from, for example, silicon oxide or silicon nitride by, for example, chemical vapor deposition, sputtering or in the case of silicon oxide by thermal growth. Top and bottom metal layers 407a/407b are formed on the insulating layers 405. The metal layer 407 is fabricated using any process compatible with embodiments of the disclosure, for example, evaporation, sputtering, chemical vapor deposition or plating. The metal layers 407a/407b comprise, for example, one or more of copper, gold, silver, nickel, titanium, tantalum, chromium, titanium nitrate, aluminum or alloys thereof.

Figure 4B:
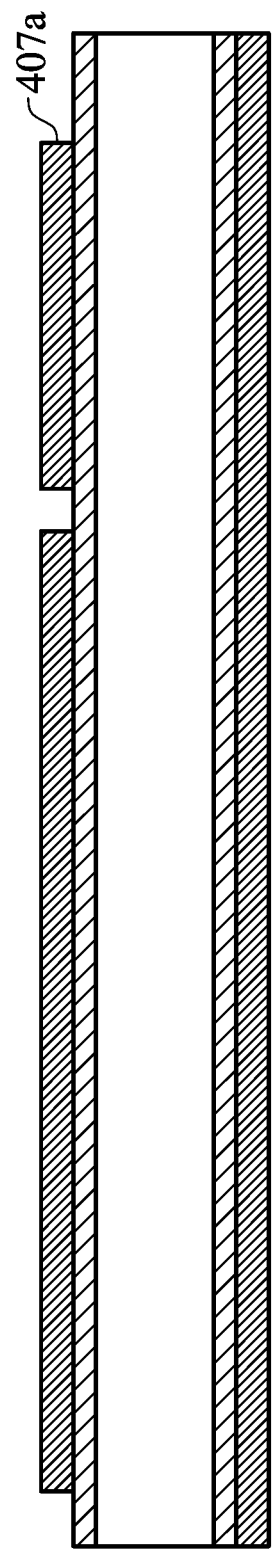

In FIG. 4B, top metal layer 407a is patterned and etched using processes similar to one or more of the photoresist process and etching process used to pattern layer 305.

In other embodiments, the metal layer 407a is formed and patterned by a lift-off process. In other embodiments, metal layers 407a and 407b are polysilicon.

The patterned top metal layer 407a forms the electrodes 132 and wiring from the vias to the bond pads 112 of the device 100 or the wiring, optional electrodes on the substrate and bond pads 207 of the device 200.

Figure 4C:
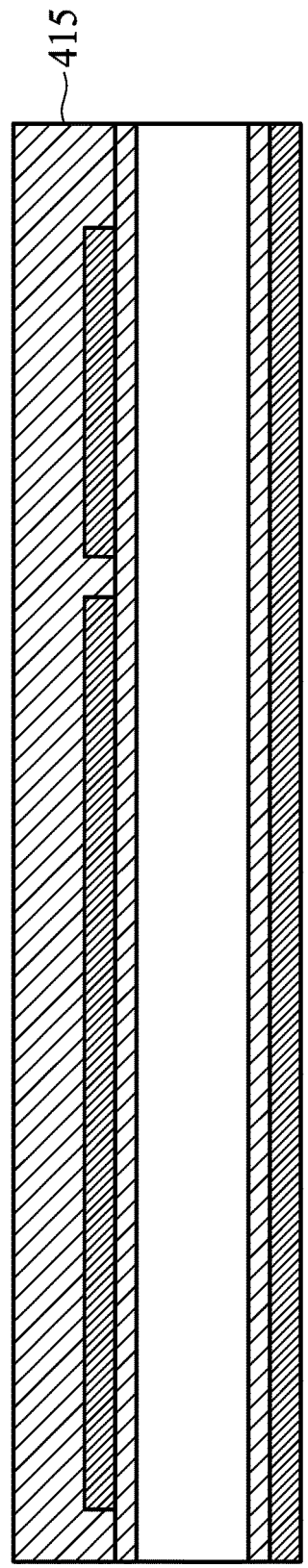

In FIG. 4C, an oxide layer 415 is formed over the top metal layer 407a. The oxide layer 415 is formed by, for example, chemical vapor deposition, sputtering or plasma enhanced chemical vapor deposition.

Figure 4D:
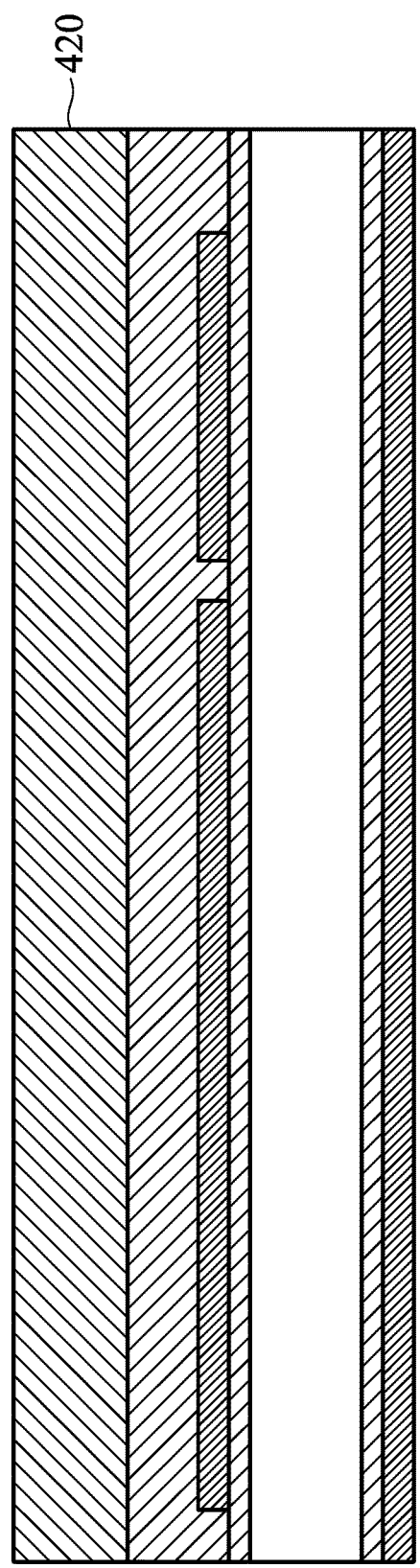

In FIG. 4D, polysilicon layer 420 is deposited on the oxide layer 415. The free portion 220 of the device 200 and the inner portion 120 of device 100 are ultimately formed from the polysilicon layer 420.

Figure 4E:
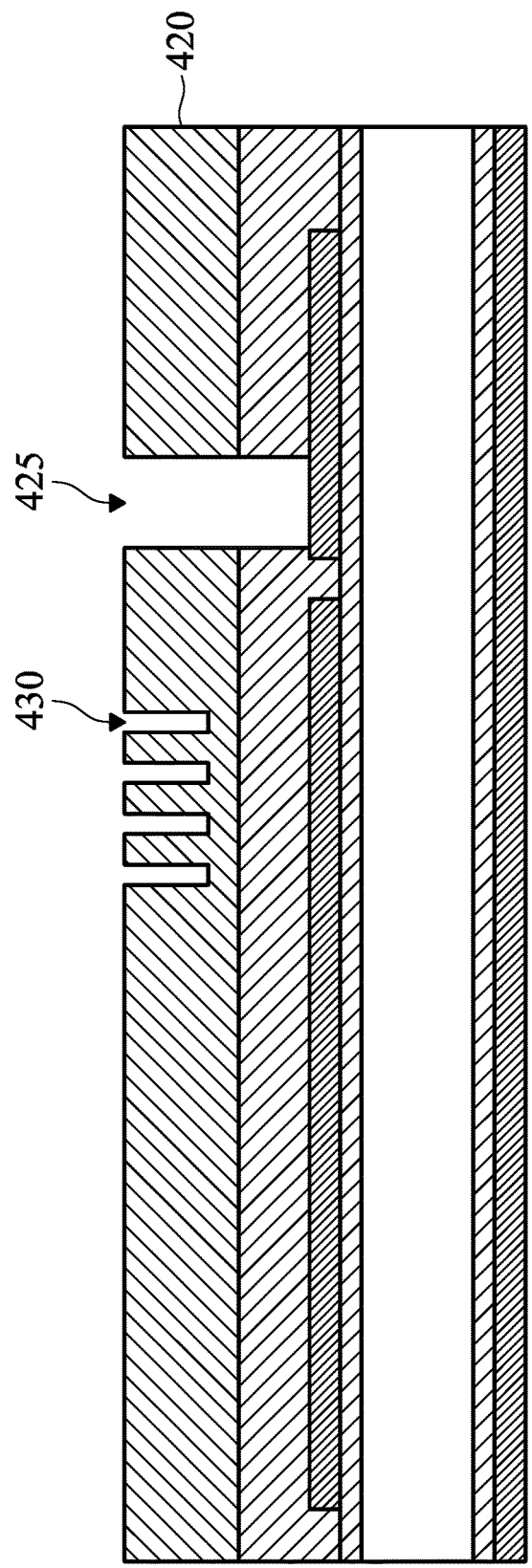

In FIG. 4E, the polysilicon layer 420 is patterned and etched in one or more etch processes to form through-holes 425 and trenches 430 using processes similar to one or more of the photoresist process and etching process used to pattern layer 305.

Figure 4F:
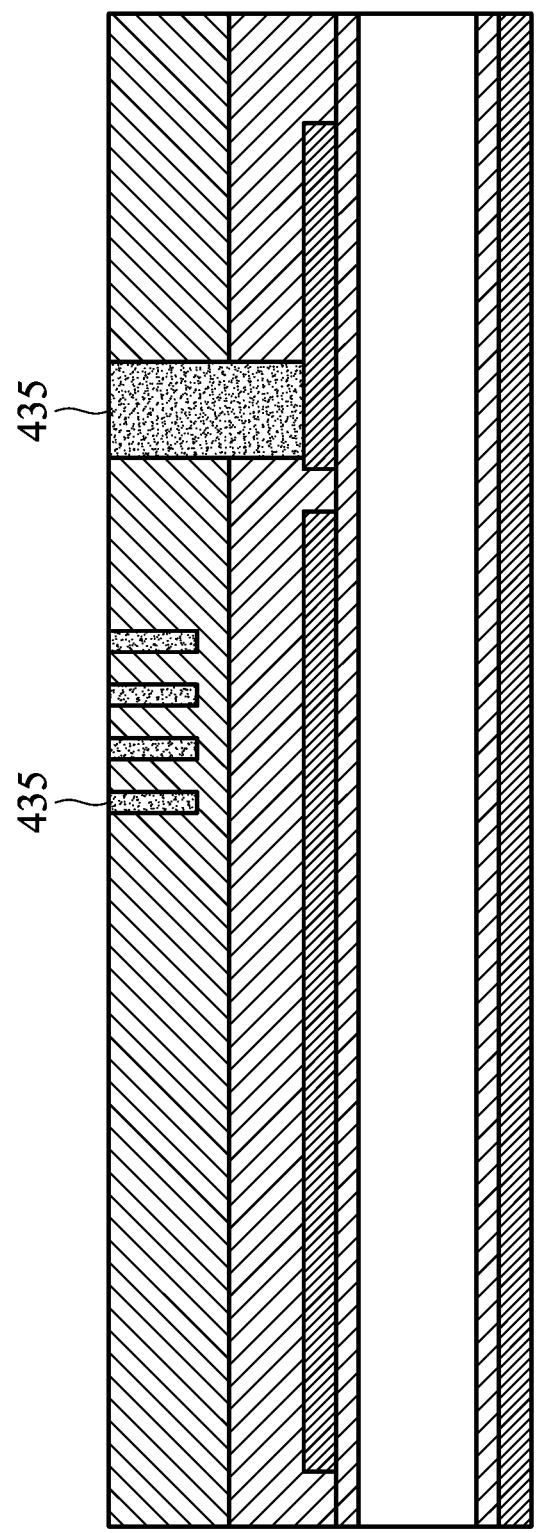

In FIG. 4F, the through-holes 425 and trenches 430 are filled with a conducting material 435, for example, titanium nitrate and tungsten using, for example, a chemical vapor deposition and polishing process. The material in the trenches forms the first and second wire loops 130, 145 of the device 100 and the wire loop 230 of the device 200 and the vias connecting the first and second wire loops 130, 145 and the wire loop 230 to the bond pads 112, 207.

In embodiments in which 407a and 407b are polysilicon, the oxide layer 415 is deposited and patterned to form the through-holes 425. Polysilicon is deposited over the oxide layer 415 to form a continuous polysilicon layer 420. The continuous polysilicon layer is subsequently patterned to form trenches 430. The conductive material 435 are formed in the trenches 430.

Figure 4G:
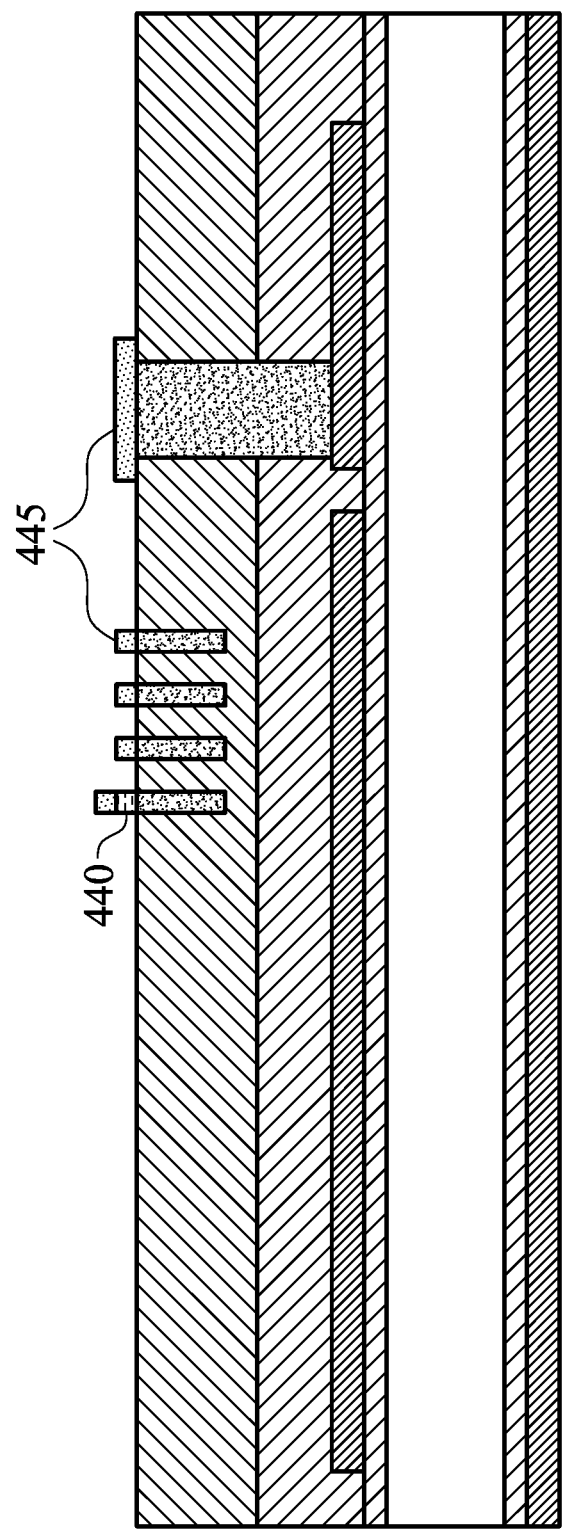

In FIG. 4G, insulation material 440, for example, silicon dioxide or silicon nitride is formed over the polysilicon layer 420 and the conducting material 435. The insulation material 440 is patterned and etched using processes similar to one or more of the photoresist process and etching process used to pattern layer 305. Over the patterned insulation material 440, wiring 445 is formed. The wiring 445 corresponds to connection wire 150 of the device 100 and the first and second connection wires 235, 240 of the device 200.

Figure 4H:
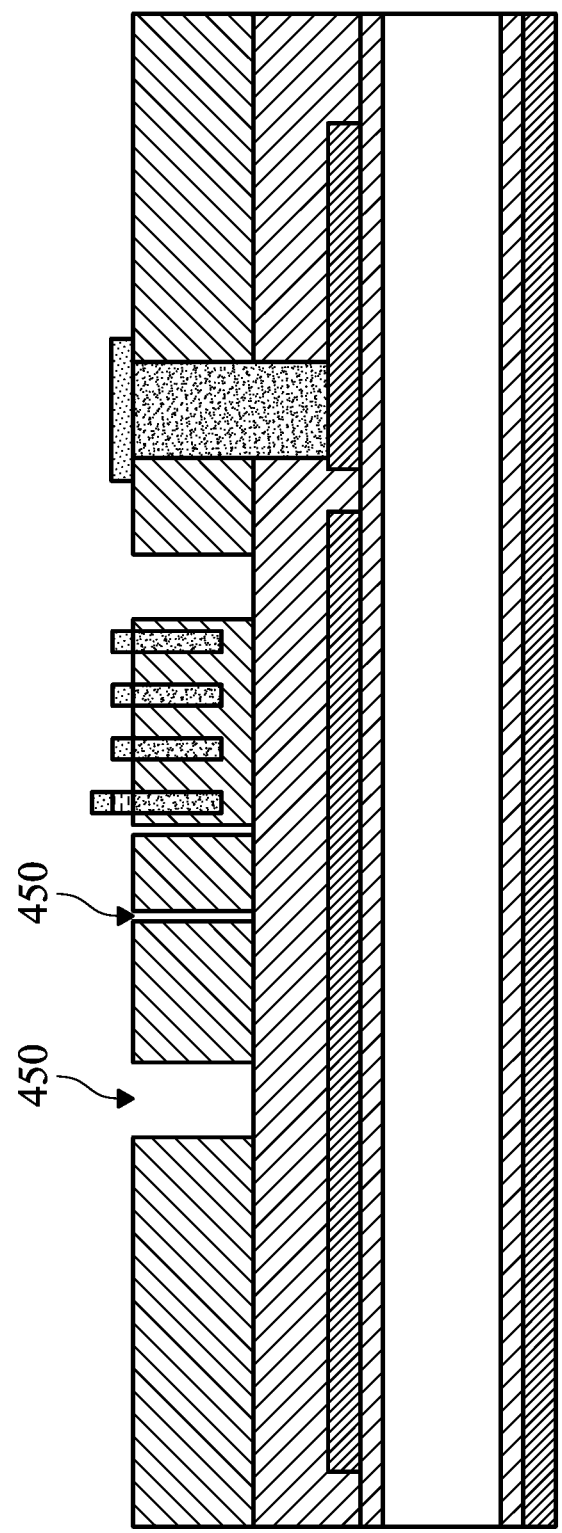

In FIG. 4H, slots 450 are etched through the polysilicon layer 420. The slots 450 delineate the inner portion 120 and the elastic connections 125 of the device 100 and the hairpin springs 225, anchor portions 215, free portion 220 and electrodes 222, 224 of the device 200.

Figure 4I:
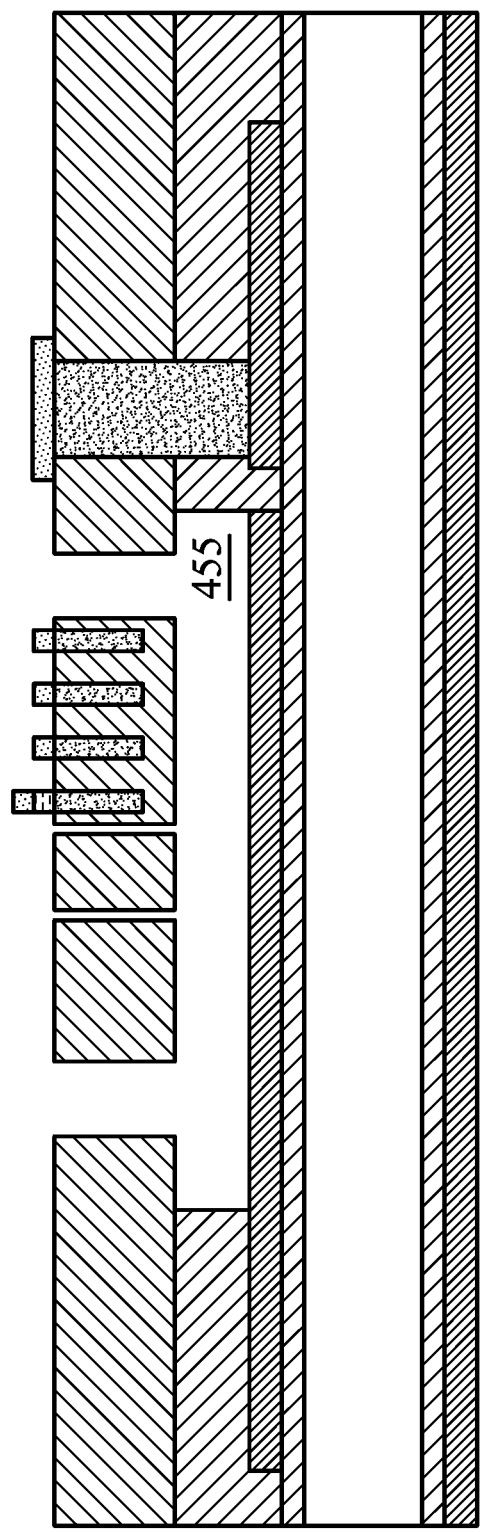

In FIG. 4I, portions 455 of the oxide layer 415 are etched via the slots 450 by, for example, an HF vapor etch or a buffered HF wet etch.

Figure 4J:
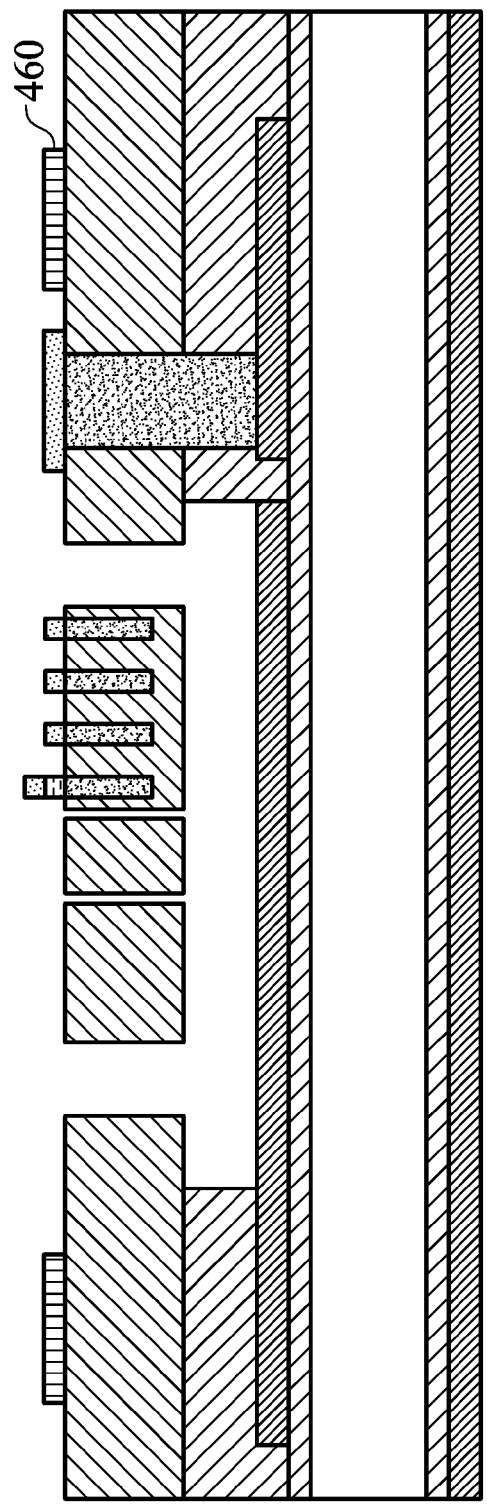

In FIG. 4J, a bonding ring 460 is formed and patterned on top of polysilicon layer 420 using processes similar to one or more of the photoresist process and etching process used to pattern layer 305.

In other embodiments, the bonding ring 460 is formed and patterned by lift-off process. In some embodiments, the bonding ring 460 is formed and patterned at the same time as forming wiring 445 or immediately after formation of wiring 445.

Figure 4K:
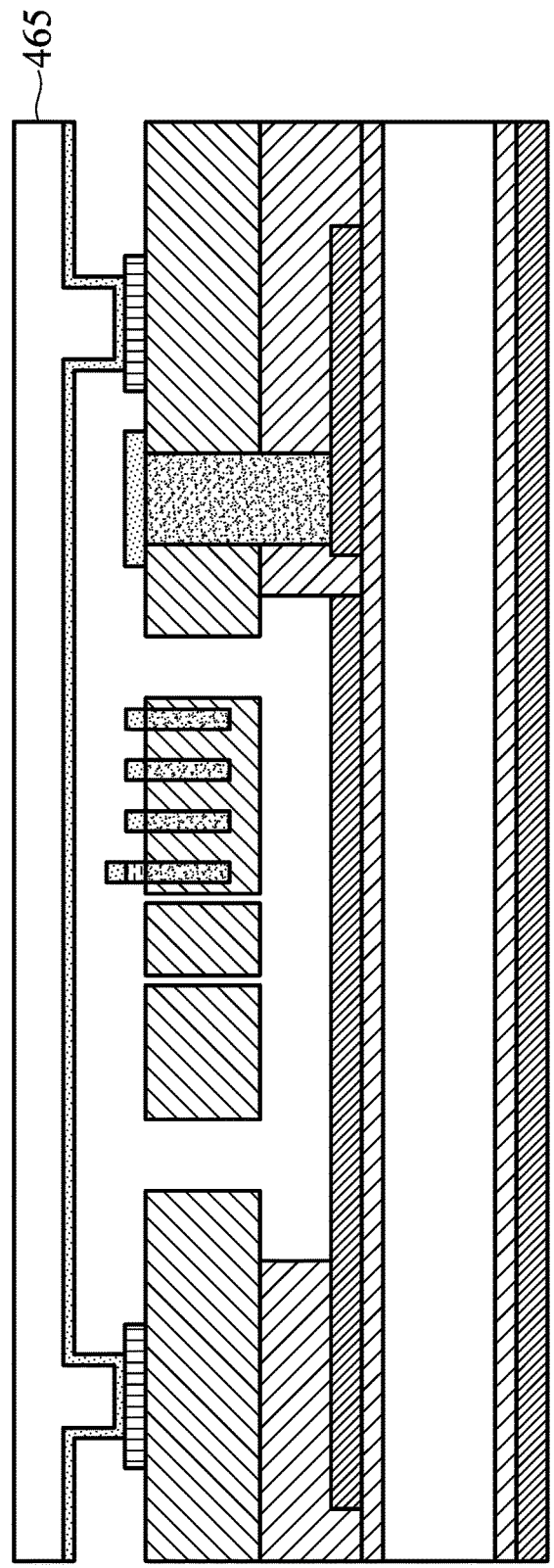

In FIG. 4K, a capping wafer 465 is bonded to the bonding ring 460 around the device 100 or the device 200.

An optional hard magnetic layer 385 (FIG. 3K) is coated on the backside of the substrate 410 over bottom metal layer 407b and a top surface of the capping wafer 465. The optional hard magnetic layer 385 is magnetized so that the field generated by the permanent magnet formed by the magnetized magnetic layer 385 causes current generation in the second wire loop 145 or the wire loop 230 if the second wire loop 145 or the wire loop 230 moves relative to the magnetic field.

In both of the processes depicted in FIGS. 3A-3K and 4A-4K the capping wafer 380, 465 and the bonding rings form a seal that protects the device 100 and the device 200 from the environment.

Figure 5:
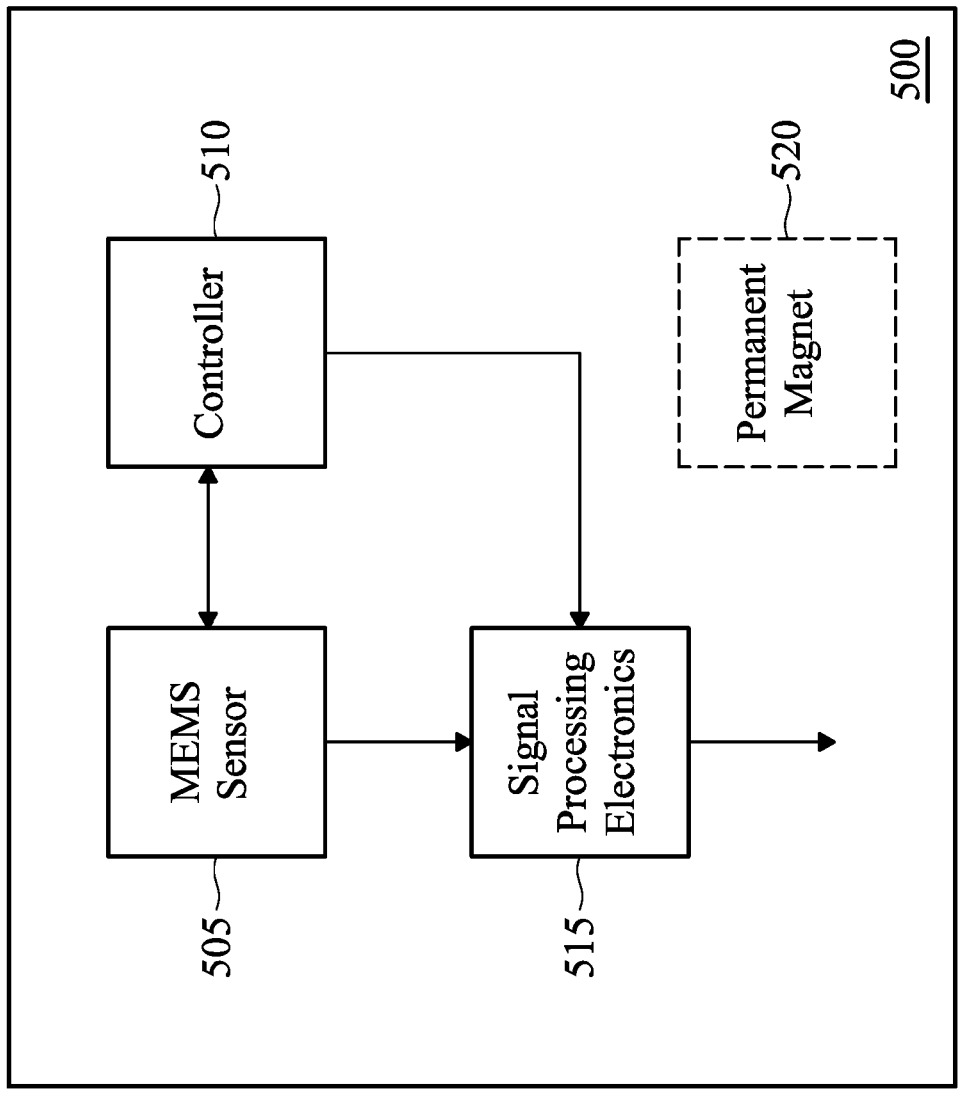
FIG. 5 is a high-level functional block diagram of a sensor system including the device of FIG. 1 or the device of FIG. 2 according to an embodiment.

FIG. 5 is a functional diagram of a sensor system 500 according to an embodiment. Sensor system 500 comprises a MEMS sensor 505, a controller 510, signal processing electronics 515 and an optional permanent magnet 520. The MEMS sensor 505 comprises one or more MEMS sensors with energy-harvester 100, 200 described above. The controller 510 controls the MEMS sensor 505 and collects energy from the energy-harvester, redistributing the collected energy to the MEMS sensor 505 and the signal processing electronics 515, thus reducing the power consumption of the sensor system. In some embodiments, the MEMS sensor 505 is on the same substrate as a substrate on which the controller 510 and signal processing electronics 515 is formed. In some embodiments, the controller 510 and signal processing electronics 515 are formed on the substrate beneath the MEMS sensor 505. In some embodiments, the controller 510 and signal processing electronics 515 are formed on the same substrate as the MEMS sensor 505 but in a different portion of the substrate, either at the same side or a different side from the side where the sensor is formed. In other embodiments, the controller 510 and signal processing electronics 515 for the sensor system 500 are formed on a separate substrate and wire bonded or die bonded to the substrate with the MEMS sensor 505. The optional permanent magnet 520 produces a magnetic field for the energy-harvester of the MEMS sensor 505.

One aspect of this description relates a semiconductor device including a moveable element over a substrate, wherein the moveable element is moveable relative to the substrate. The semiconductor device further includes a first anchor portion connected to the substrate; and a second anchor portion connected to the substrate on an opposite side of the moveable element from the first anchor portion. The semiconductor device further includes a first connector configured to connect the moveable element to the first anchor portion. The semiconductor device further includes a second connector configured to connect the moveable element to the second anchor portion. The semiconductor device further includes a conductive wire loop on the moveable element; and a connection wire electrically connected to a first end of the conductive wire loop, wherein the connection wire extends across the first connector to the first anchor portion.

Another aspect of this description relates to a semiconductor device including a moveable element over a substrate, wherein the moveable element is moveable relative to the substrate. The semiconductor device further includes a raised portion connected to the substrate, wherein the raised portion surrounds the moveable element. The semiconductor device further includes a first connector configured to connect the moveable element to the raised portion on a first side of the moveable element. The semiconductor device further includes a second connector configured to connect the moveable element to the raised portion on a second side of the moveable element opposite the first side. The semiconductor device further includes a conductive wire loop on the moveable element; and a connection wire electrically connected to a first end of the conductive wire loop, wherein the connection wire extends across the first connector to the raised portion.

Still another aspect of this description relates to a semiconductor device including a moveable element over a substrate, wherein the moveable element is moveable relative to the substrate. The semiconductor device further includes a raised portion connected to the substrate. The semiconductor device further includes a first connector configured to connect the moveable element to the raised portion on a first side of the moveable element. The semiconductor device further includes a second connector configured to connect the moveable element to the raised portion on a second side of the moveable element opposite the first side. The semiconductor device further includes a conductive wire loop on the moveable element. The semiconductor device further includes a first connection wire electrically connected to a first end of the conductive wire loop, wherein the first connection wire extends across the first connector to the raised portion. The semiconductor device further includes a second connection wire electrically connected to a second end of the conductive wire loop, wherein the second connection wire extends across the second connector to the raised portion.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A device comprising:
   a moveable element over a substrate, wherein the moveable element is moveable relative to the substrate;
   a first anchor portion connected to the substrate;
   a second anchor portion connected to the substrate on an opposite side of the moveable element from the first anchor portion;
   a first connector configured to connect the moveable element to the first anchor portion;
   a second connector configured to connect the moveable element to the second anchor portion, wherein the first connector and the second connector are configured to permit the movable element to rotate about an axis parallel to a top surface of the substrate;
   a conductive wire loop on the moveable element; and
   a connection wire electrically connected to a first end of the conductive wire loop, wherein the connection wire extends across the first connector to the first anchor portion.

2. The device of claim 1, wherein the first connector comprises a hairpin spring.

3. The device of claim 1, wherein the conductive wire loop has a spiral shape and the first end of the conductive wire loop is located in an interior of the spiral.

4. The device of claim 1, wherein the first connector and the second connector are configured to permit the movable element to translate in a direction perpendicular to a top surface of the substrate.

5. The device of claim 1, further comprising a plurality of electrodes, wherein the plurality of electrodes is located outside a periphery of the movable element in a top view.

6. The device of claim 1, further comprising a second connection wire connected to a second end of the conductive wire loop, wherein the second connection wire extends along the second connector.

7. The device of claim 1, further comprising at least one bond pad on the substrate, wherein the at least one bond pad is spaced from the movable element in a direction parallel to a top surface of the substrate.

8. The device of claim 7, wherein the connection wire is electrically connected to the at least one bond pad by a via extending through the first anchor point.

9. A device comprising:
   a moveable element over a substrate, wherein the moveable element is moveable relative to the substrate;
   a raised portion connected to the substrate, wherein the raised portion surrounds the moveable element;
   a first connector configured to connect the moveable element to the raised portion on a first side of the moveable element;
   a second connector configured to connect the moveable element to the raised portion on a second side of the moveable element opposite the first side, wherein the raised portion connected to the first connector is continuous with the raised portion connected to the second connector;
   a conductive wire loop on the moveable element; and
   a connection wire electrically connected to a first end of the conductive wire loop, wherein the connection wire extends across the first connector to the raised portion.

10. The device of claim 9, wherein the first connector an elastic connector.

11. The device of claim 9, wherein the conductive wire loop has a spiral shape and the first end of the conductive wire loop is located in an interior of the spiral.

12. The device of claim 9, wherein the first connector and the second connector are configured to permit the movable element to rotate about an axis parallel to a top surface of the substrate.

13. The device of claim 9, wherein the moveable element is a square, a polygon, an ellipsoid or a circle.

14. The device of claim 9, wherein a shape of the raised portion is different from a shape of the moveable element.

15. The device of claim 9, further comprising a second connection wire connected to a second end of the conductive wire loop, wherein the second connection wire extends along the second connector to the raised portion.

16. The device of claim 9, further comprising a plurality of electrodes on the substrate, wherein the plurality of electrodes is located below the movable element in a top view.

17. A device comprising:
   a moveable element over a substrate, wherein the moveable element is moveable relative to the substrate;
   a raised portion connected to the substrate;
   a first connector configured to connect the moveable element to the raised portion on a first side of the moveable element;
   a second connector configured to connect the moveable element to the raised portion on a second side of the moveable element opposite the first side;
   a conductive wire loop on the moveable element;

a first connection wire electrically connected to a first end of the conductive wire loop, wherein the first connection wire extends across the first connector to the raised portion; and a second connection wire electrically connected to a second end of the conductive wire loop, wherein the second connection wire extends across the second connector to the raised portion.

18. The device of 17, wherein the raised portion comprises:

a first anchor portion on the substrate located on the first side of the moveable element; and a second anchor portion on the substrate located on the second side of the moveable element.

19. The device of claim 17, wherein the raised portion is continuous with the substrate.

20. The device of claim 17, further comprising a second wire loop on the moveable element, wherein the second wire loop surrounds the conductive wire loop.

* * * * *